United States Patent
Salami et al.

(10) Patent No.: US 8,076,570 B2
(45) Date of Patent: *Dec. 13, 2011

(54) ALUMINUM-BORON SOLAR CELL CONTACTS

(75) Inventors: Jalal Salami, San Marcos, CA (US); Srinivasan Sridharan, Strongsville, OH (US); Steve S. Kim, Goleta, CA (US); Aziz S. Shaikh, San Diego, CA (US)

(73) Assignee: Ferro Corporation, Mayfield Village, OH (US)

( * ) Notice: Subject to any disclaimer, the term of this patent is extended or adjusted under 35 U.S.C. 154(b) by 1177 days.

This patent is subject to a terminal disclaimer.

(21) Appl. No.: 11/384,838

(22) Filed: Mar. 20, 2006

(65) Prior Publication Data

US 2007/0215202 A1    Sep. 20, 2007

(51) Int. Cl.
*H01L 31/00*    (2006.01)
(52) U.S. Cl. ........ 136/256; 136/243; 136/255; 136/258; 438/57
(58) Field of Classification Search .................... 136/243
See application file for complete search history.

(56) References Cited

U.S. PATENT DOCUMENTS

| | | | |
|---|---|---|---|
| 3,900,945 A | 8/1975 | Kay et al. | |
| 4,070,517 A * | 1/1978 | Kazmierowicz | 428/209 |
| 4,088,502 A | 5/1978 | La Bar | |
| 4,163,678 A | 8/1979 | Bube | |
| 4,235,644 A | 11/1980 | Needes | |
| 4,703,553 A | 11/1987 | Mardesich | |
| 4,899,704 A | 2/1990 | Kronich | |
| 5,074,920 A | 12/1991 | Gonsiorawski et al. | |
| 5,178,685 A | 1/1993 | Borenstein et al. | |
| 5,468,652 A * | 11/1995 | Gee | 438/98 |
| 5,584,941 A | 12/1996 | Nishida | |
| 5,922,627 A * | 7/1999 | Nabatian et al. | 501/17 |
| 5,928,438 A | 7/1999 | Salami et al. | |
| 5,942,048 A | 8/1999 | Fujisaki et al. | |
| 6,069,065 A * | 5/2000 | Arimoto et al. | 438/612 |
| 6,071,753 A * | 6/2000 | Arimoto | 438/57 |
| 6,093,882 A * | 7/2000 | Arimoto | 136/252 |
| 6,096,968 A | 8/2000 | Schlosser et al. | |
| 6,262,359 B1 | 7/2001 | Meier et al. | |
| 6,402,839 B1 | 6/2002 | Meier et al. | |
| 6,469,243 B2 | 10/2002 | Yamanaka et al. | |
| 6,576,391 B1 | 6/2003 | Iguchi et al. | |
| 6,626,993 B2 | 9/2003 | Meier et al. | |
| 6,692,981 B2 | 2/2004 | Takato et al. | |

(Continued)

OTHER PUBLICATIONS

Krause, et al., Determination of Aluminum Diffusion Parameters in Silicon, Journal of Applied Physics 91, May 1, 2002.*

(Continued)

*Primary Examiner* — Jennifer K. Michener
*Assistant Examiner* — Matthew Martin
(74) *Attorney, Agent, or Firm* — Rankin, Hill & Clark LLP

(57) ABSTRACT

Formulations and methods of making solar cells are disclosed. In general, the invention provides a solar cell comprising a contact made from a mixture wherein, prior to firing, the mixture comprises at least one aluminum source, at least one boron source, and about 0.1 to about 10 wt % of a glass component. Within the mixture, the overall content of aluminum is about 50 wt % to about 85 wt % of the mixture, and the overall content of boron is about 0.05 to about 20 wt % of the mixture.

11 Claims, 1 Drawing Sheet

Total Carrier (Boron + Aluminum) concentration vs. depth into silicon wafer in microns.

U.S. PATENT DOCUMENTS

| | | | |
|---|---|---|---|
| 6,695,903 B1 | 2/2004 | Kubelbeck et al. | |
| 6,710,239 B2 | 3/2004 | Tanaka | |
| 6,737,340 B2 | 5/2004 | Meier et al. | |
| 6,777,716 B1 | 8/2004 | Yamazaki et al. | |
| 6,784,037 B2 | 8/2004 | Yamazaki et al. | |
| 6,784,457 B2 | 8/2004 | Yamazaki et al. | |
| 6,814,795 B2 | 11/2004 | McVicker et al. | |
| 6,825,104 B2 | 11/2004 | Horzel et al. | |
| 6,835,888 B2 | 12/2004 | Sano et al. | |
| 6,909,114 B1 | 6/2005 | Yamazaki | |
| 6,977,394 B2 | 12/2005 | Yamazaki et al. | |
| 6,987,358 B2 * | 1/2006 | Fujimine et al. | 313/586 |
| 6,989,111 B2 * | 1/2006 | Hormadaly | 252/521.1 |
| 7,008,891 B2 * | 3/2006 | Kobayashi et al. | 501/6 |
| 7,098,158 B2 * | 8/2006 | Natsugari et al. | 501/78 |
| 7,438,829 B2 * | 10/2008 | Cho et al. | 252/181.1 |
| 2003/0154592 A1 * | 8/2003 | Felten | 29/610.1 |
| 2004/0155227 A1 * | 8/2004 | Bechtloff et al. | 252/500 |
| 2005/0176164 A1 | 8/2005 | Gee et al. | |
| 2006/0102228 A1 | 5/2006 | Sridharan et al. | |
| 2006/0289055 A1 | 12/2006 | Sridharan et al. | |

OTHER PUBLICATIONS

KB Alloys product listing from Jan. 2004, www.kballoys.com, obtained from www.web.archive.org.*

Greenhunt, "Effects of composition, processing, and structure on properties of ceramics and glasses", ASM Handbooks, 2002.*

* cited by examiner

Figure 1. Total Carrier (Boron + Aluminum) concentration vs. depth into silicon wafer in microns.
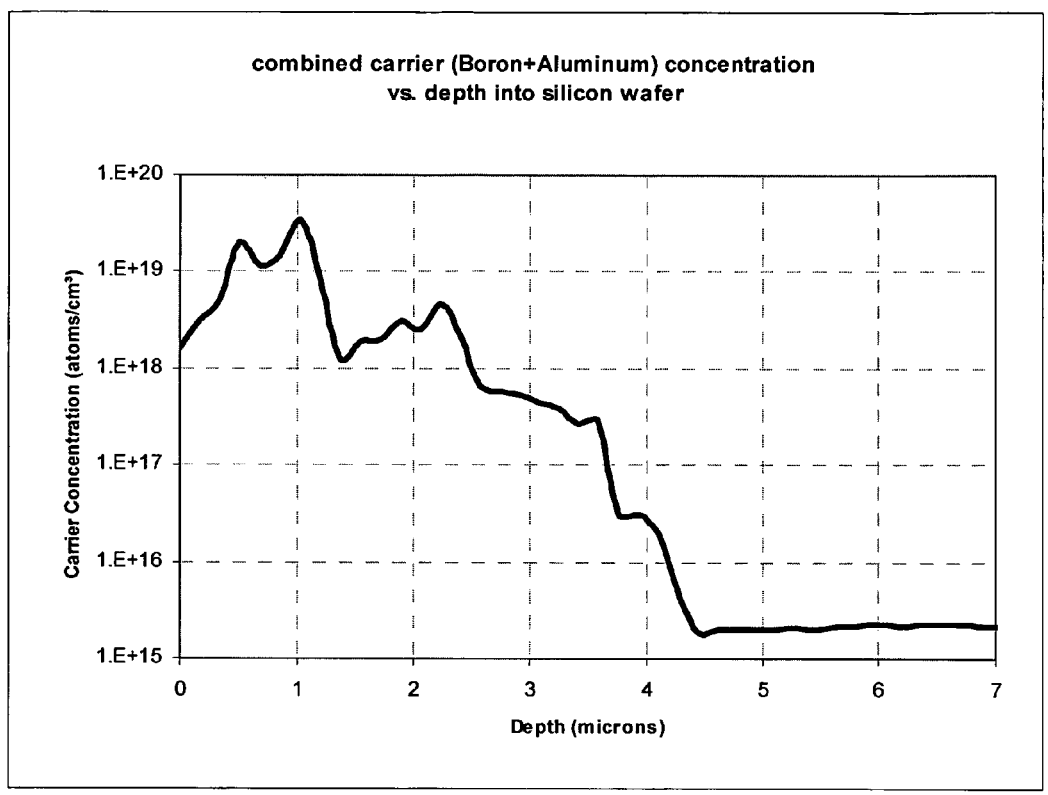

ALUMINUM-BORON SOLAR CELL CONTACTS

FIELD OF THE INVENTION

This invention relates to an aluminum-boron conductor formulation made from conductive aluminum particles, boron containing sources, inorganic additives, and glass frit dispersed in an organic system. The formulations are mainly screen-printable and suitable for use in the fabrication of photovoltaic devices. These formulations could also be applied by other methods such as spraying, hot melt printing, ink jet printing, pad printing and tape lamination techniques with suitable modifications of organics.

BACKGROUND

Solar cells are generally made of semiconductor materials, such as silicon (Si), which convert sunlight into useful electrical energy. A solar cell contact is in generally made of thin wafers of Si in which the required PN junction is formed by diffusing phosphorus (P) from a suitable phosphorus source into a P-type Si wafer. The side of the silicon wafer on which sunlight is incident is generally coated with an anti-reflective coating (ARC) to prevent reflective loss of sunlight. This ARC increases the solar cell efficiency. A two dimensional electrode grid pattern known as a front contact makes a connection to the N-side of silicon, and a coating of predominantly aluminum (Al) makes connection to the P-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the PN junction to the outside load.

Conventional pastes for solar cell contacts contain lead frits. Inclusion of PbO in a glass component of a solar cell paste has the desirable effects of (a) lowering the firing temperature of paste compositions, (b) facilitating interaction with the silicon substrate and, upon firing, helping to form low resistance contacts with silicon. For these and other reasons PbO is a significant component in many conventional solar cell paste compositions. However, in light of environmental concerns, the use of PbO (as well as CdO), in paste compositions is now largely avoided whenever possible. Hence a need exists in the photovoltaic industry for lead-free and cadmium-free paste compositions, which afford desirable properties using lead-free and cadmium-free glasses in solar cell contact pastes.

Presently, a typical solar cell silicon wafer is about 200-300 microns thick, and the trend is toward thinner wafers. Because the wafer cost is about 60% of the cell fabrication cost, the industry is seeking ever-thinner wafers, approaching 150 microns. As the wafer thickness decreases, the tendency toward bowing (bending) of the cell due to the sintering stress increases, which is generated by the great difference in the thermal coefficients of expansion (TCE) between aluminum ($232 \times 10^{-7}/°$ C. @ 20-300° C.) and silicon, ($26 \times 10^{-7}/°$ C. @ 20-300° C.).

Known methods of mitigating silicon wafer bowing include reduction of aluminum content during screen-printing that causes incomplete formation of Back Surface Field (BSF) layers and requires a higher firing temperature to achieve the same results. Chemical (acid) etching has been used to remove the Al—Si alloy that forms after firing the Aluminum paste. This is just another step in the manufacturing process that leads to additional cost.

Another approach is to use additives to reduce the thermal expansion mismatch between the Al layer and the silicon wafer. However, a drawback is a reduction in rear surface passivation quality and a concomitant reduction in solar cell performance. Partial covers, where only a portion of the back side of the wafer is coated with aluminum, have been used on the back surface field to counteract bowing, which causes a reduction in cell performance.

Finally, another conventional way to reduce or eliminate bowing is cooling a finished solar cell from room temperature to ca. −50° C. for several seconds after firing. With such plastic deformation of the Al—Si paste matrix, bowing is largely eliminated, but this represents an additional process step, and there is a high danger of breakage from thermal stress.

Hence a need exists in the photovoltaic industry for a low-bow, high-performance aluminum back surface field in a solar cell contact, a method of making such a contact, and the Al paste from which such a BSF is formed.

SUMMARY OF THE INVENTION

The present invention provides an aluminum-boron paste for application to a silicon solar cell having a p+ and n+ layer for the formation of a back-surface-field (BSF) and an emitter. The boron-doped aluminum contact formed by firing the paste eliminates or minimizes bowing of ultra thin silicon wafers, thereby improving reliability and electrical performance of solar cells made therewith, as measured by low series resistance ($R_S$) and high shunt resistance ($R_{sh}$) high efficiency ($\eta$) and high fill factor (FF), as well as reducing breakage.

Generally, the present invention includes a solar cell comprising a contact. The contact is made from a mixture wherein prior to firing, the mixture comprises at least one aluminum source, at least one boron source, and about 0.1 to about 10 wt % of a glass component. The content of aluminum is about 50 wt % to about 85 wt % of the mixture, and the content of boron is about 0.05 to about 20 wt % of the mixture.

Another embodiment of the invention is a solar cell comprising a silicon wafer, aluminum, and boron, wherein the combined concentration of aluminum and boron (Al+B) at a depth of about 0 to about 5 microns in the silicon wafer is about $10^{18}$ to about $10^{20}$ atoms per cubic centimeter ($cm^3$).

The compositions and methods of the present invention overcome the drawbacks of the prior art by optimizing interaction, bonding, and contact formation between back contact (BSF) components, typically silicon with Al through a properly formulated aluminum-boron paste. A conductive paste containing aluminum, boron, and a glass component, is printed on a silicon substrate, and fired to fuse the glass, sinter the metal, and provide aluminum doping into the silicon wafer to a depth of several microns. Upon firing, for a back contact, a p+ layer is formed, which is overlaid by an Al—Si eutectic layer, and which in turn is overlaid by aluminum layer which could contain boron.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

BRIEF DESCRIPTION OF THE DRAWINGS

FIG. 1 is a graph showing the combined concentration of aluminum and boron as a function of depth into a silicon wafer in a solar cell contact in accordance with the invention.

DETAILED DESCRIPTION OF THE INVENTION

Broadly, the invention provides a solar cell comprising a contact. The contact is made from a mixture wherein prior to firing, the mixture comprises at least one aluminum source, at least one boron source, and about 0.1 to about 10 wt % of a glass component. The content of aluminum is about 50 wt % to about 85 wt % of the mixture, and the content of boron is about 0.05 to about 20 wt % of the mixture.

Another embodiment of the invention is a solar cell comprising a silicon wafer, aluminum, and boron, wherein the combined concentration of aluminum and boron (Al+B) at a depth of about 0 to about 5 microns in the silicon wafer is about $10^{18}$ to about $10^{20}$ atoms per cubic centimeter ($cm^3$).

Another embodiment of the invention is a solar cell comprising a silicon wafer, aluminum, and boron, wherein the combined concentration of aluminum and boron (Al+B) at a depth of about 0 to about 5 microns in the silicon wafer is about $10^{18}$ to about $10^{20}$ atoms per cubic centimeter ($cm^3$).

An aluminum back contact makes contact with both Si and the Ag/Al rear contact layer. In a back contact, the metal component preferably comprises aluminum and boron, and the glass component may be one of several types. Bismuth based glasses and alkali titanium silicate glasses each have certain advantages over the prior art when used in a solar cell back contact.

Broadly, thick film pastes containing aluminum and glass frit are used to make back contacts for silicon-based solar cells to conduct to an external load the current generated by exposure to light. While the paste is generally applied by screen-printing, methods such as extrusion, pad printing, ink jet printing, and hot melt printing may also be used. Further with suitable organics modifications the mixture of the present invention could be applied by tape lamination techniques. Solar cells with screen-printed front contacts are fired to relatively low temperatures (550° C. to 850° C. wafer temperature; furnace set temperatures of 650° C. to 1000° C.) to form a low resistance contact between the P-side of an aluminum doped silicon wafer and an aluminum based paste. Methods for making solar cells are also envisioned herein.

Aluminum- and glass-containing back contacts are used to form low resistance ohmic contacts on the back side of the solar cell due to large area melting and re solidification of Al doped ($p^+$) epitaxially grown Si layer which increases the solar cell performance due to improved back surface field. For optimum performance a thick $p^+$ re-grown region is believed to be ideal. It is also believed that the rejection of metallic impurities from the epitaxially growing $p^+$ layer leads to high carrier lifetimes. These two factors are believed to increase the open circuit voltage, and more importantly, the open circuit voltage falls only slightly as the bulk resistivity increases. Therefore solar cell performance improves due to the formation of a substantial epitaxially re-grown $p^+$ layer in the Al back contact.

For a back contact, upon firing, a $p^+$ layer forms on the underlying silicon by liquid-phase epitaxy. This occurs during the resolidification of the aluminum-silicon (Al—Si) melt. High-bismuth lead-free and cadmium-free glasses allow low firing temperatures in making front contacts owing to their excellent flow characteristics relatively at low temperatures. Alkali-titanium-silicate glasses are another route to attain lower firing temperatures. While lead-glasses are often avoided for environmental reasons, they are sometimes used because they are the only route at present to certain properties, such as extremely low melting and wetting glasses. Relatively high-silicon, low bismuth lead-free and cadmium-free glasses provide suitable properties for back contacts, without excessive interaction with backside Si. Similarly, high-bismuth lead-free and cadmium-free glasses allow the formation of suitable lead-free silver rear contacts on backside Si with optimal interaction with both Si and back contact Al layer.

Broadly construed, the inventive pastes comprise aluminum, boron, and glass. Each ingredient is detailed hereinbelow.

Paste Glasses. The pastes comprise about 0.1 to about 10 wt %, preferably 0.2 to about 5 wt % of a glass component. The glass component comprises, prior to firing, one or more glass compositions. Each glass composition comprises oxide frits including, in one embodiment, $Bi_2O_3$, $B_2O_3$ and $SiO_2$. In another embodiment, the glass composition comprises an alkali oxide, $TiO_2$, and $SiO_2$. In a third embodiment, the glass composition comprises PbO. In particular, in various embodiments of the present invention, glass compositions for back contacts may be found in Tables 1-3. The entry "20 trivalent oxides" means one or more trivalent oxides of an element selected from the group consisting of Al, Ga, In, Sc, Y, and an element having an atomic number of from 57 to 71. In formulating the pastes, the glass frits typically have particle sizes of about 0.5 to about 10 microns, although other particle sizes may be used as known in the art.

Looking to Tables 1-3, more than one glass composition can be used, and compositions comprising amounts from different columns in the same table are also envisioned. If a second glass composition is used, the proportions of the glass compositions can be varied to control the extent of paste interaction with silicon and hence the resultant solar cell properties, and to control the bowing of the silicon wafer. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain embodiments where the properties of PbO cannot be duplicated, such embodiments advantageously comprise PbO. An entry such as "$Li_2O+Na_2O+K_2O$" means that the total content of $Li_2O$ and $Na_2O$ and $K_2O$ falls within the specified ranges.

TABLE 1

Oxide frit ingredients for bismuth-based back contact glasses in mole percent.

| | Glass Composition | | |
|---|---|---|---|
| Ingredient | I | II | III |
| $Bi_2O_3$ | 5-85 | 10-75 | 12-50 |
| $B_2O_3 + SiO_2$ | 5-75 | 15-75 | 34-71 |
| $Li_2O + Na_2O + K_2O$ | 0-40 | 5-30 | 10-30 |
| 20 trivalent oxides | 0-25 | 0-20 | 3-10 |
| ZnO | 0-55 | 0-20 | 0-12 |
| $Sb_2O_5 + Nb_2O_5$ | 0-40 | 0-30 | 0-20 |
| $TiO_2 + ZrO_2$ | 0-20 | 0-10 | 1-6 |

TABLE 2

Oxide frit ingredients for alkali-titanium-silicate back contact glasses in mole percent.

| | Glass Composition | | |
|---|---|---|---|
| Ingredient | IV | V | VI |
| $Li_2O + Na_2O + K_2O$ | 5-55 | 15-50 | 30-40 |
| $TiO_2$ | 2-26 | 10-26 | 15-22 |

TABLE 2-continued

Oxide frit ingredients for alkali-titanium-silicate
back contact glasses in mole percent.

| Ingredient | Glass Composition | | |
|---|---|---|---|
| | IV | V | VI |
| $B_2O_3 + SiO_2$ | 5-75 | 25-70 | 30-52 |
| $V_2O_5 + Sb_2O_5 + P_2O_5$ | 0-30 | 0.25-25 | 5-25 |
| $MgO + CaO + BaO + SrO$ | 0-20 | 0-15 | 0-10 |
| F | 0-20 | 0-15 | 5-13 |

TABLE 3

Oxide frit ingredients for lead based
back contact glasses in mole percent.

| Ingredient | Glass Composition | | |
|---|---|---|---|
| | VII | VIII | IX |
| PbO | 15-75 | 25-66 | 50-65 |
| $B_2O_3 + SiO_2$ | 5-75 | 20-55 | 24-45 |
| ZnO | 0-55 | 0.1-35 | 0.1-25 |
| $Li_2O + Na_2O + K_2O$ | 0-40 | 0-30 | 0-10 |
| $TiO_2 + ZrO_2$ | 0-20 | 0-10 | 0.1-5 |
| 20 trivalent oxides | 0-25 | 0.1-20 | 1-10 |

In a preferred embodiment the glass component comprises: about 12 to about 50 mole % $Bi_2O_3$; about 25 to about 65 mole % $SiO_2$; about 5 to about 15 mole % $B_2O_3$; about 4 to about 26 mole % $K_2O$; $TiO_2$, wherein the content of $TiO_2$ does not exceed about 10 mole %; and an oxide of an element selected from the group Li, Na, K, Sb and combinations thereof, provided the combined total of such oxides does not exceed about 40 mol %, preferably at least about 1 mol % of the combination. In a preferred embodiment containing alkali oxides the glass component comprises about 1 to about 15 mole % $Li_2O$, about 8 to about 25 mole % $Na_2O$, about 3 to about 25 mole % $K_2O$, about 8 to about 22 mole % $TiO_2$, about 25 to about 50 mole % $SiO_2$, about 2 to about 18 mole % $V_2O_5$, and about 0.25 to about 5 mole % $P_2O_5$, and may further comprise fluoride, not to exceed about 20 mol %.

In another preferred embodiment, the composition may comprise one or more of the following, so long as the content of the following oxides does not exceed the indicated amount in mol % $Li_2O$ (15%), $Na_2O$ (25%), $K_2O$ (25%), $TiO_2$ (22%), $SiO_2$ (60%), $V_2O_5$ (18%), the sum of ($Sb_2O_5+V_2O_5+P_2O_5$) (25%), and F (15%)

The most preferred embodiments are those using lead free and cadmium free glasses discussed above. However, when properties unattainable by other than leaded glasses are required, then the glass component may comprise one or more of the following, so long as the content of the following oxides does not exceed the indicated amount in mol % PbO (65%), $SiO_2$ (30%), $B_2O_3$ (30%), ZnO (25%), and trivalent oxides of elements selected from the group consisting of Al, Ga, In, Sc, Y, La (25%), and ($TiO_2+ZrO_2$) (5%), provided that the total of ($B_2O_3+SiO_2$) does not exceed 45%. The lead-containing glass components may further comprise about 0.1 to about 8 mol % $Al_2O_3$.

Metal Component. In a solar cell contact, the metal must be conductive. In a back contact, the metal component comprises aluminum. The aluminum metal component may come in any suitable form, including aluminum metal powder, an alloy of aluminum, an aluminum salt, and organometallic aluminum, an oxide of aluminum, and an aluminum-containing glass. The aluminum particles used in the paste may be spherical, flaked, or provided in a colloidal suspension, and combinations of the foregoing may be used. In formulating the pastes, the metal powders typically have particle sizes of about 0.1 to about 40 microns, preferably less than 10 microns. For example the paste may comprise about 80 to about 99 wt % spherical aluminum particles or alternatively about 75 to about 90 wt % aluminum particles and about 1 to about 10 wt % aluminum flakes. Alternatively the paste may comprise about 75 to about 90 wt % aluminum flakes and about 1 to about 10 wt % of colloidal aluminum, or about 60 to about 95 wt % of aluminum powder or aluminum flakes and about 0.1 to about 20 wt % of colloidal aluminum. Suitable commercial examples of aluminum particles are available from Alcoa, Inc., Pittsburgh, Pa.; Ampal Inc., Flemington, N.J.; and ECKA Granulate GmbH & Co. K G, of Fürth, Germany.

An alloy of aluminum may be used, including those comprising aluminum and a metal selected from the group consisting of boron, silicon, gallium, indium, antimony, and magnesium. In one embodiment, the alloy provides both aluminum and boron, namely, as an aluminum-boron alloy, which comprises about 60 to about 99.9 wt % aluminum and about 0.1 to about 40 wt % boron. In a preferred embodiment an aluminum-boron alloy containing 0.2 weight % B could be used for up to 98 wt % of the paste mixture to provide both aluminum and boron to the mixture. In yet another preferred embodiment, one or more of the alloys Al—Si, Al—Mg, Al—Ga, Al—In, Al—Sb, Al—Sn, and Al—Zn may constitute up to about 50 wt % of the mixture.

The boron source may boron metal powder, an alloy of boron, a salt of boron, boric acid, organometallic boron, an oxide of boron, and boron-containing glass. Combinations of the foregoing may be used. In particular, the boron source may be sodium borate, calcium borate, potassium borate, magnesium borate, $B_2O_3$ containing glass and combinations thereof. In a preferred embodiment, an organometallic boron solution could be used to provide boron, wherein such boron does not exceed about 5 wt % of the paste mixture.

The Al—B pastes herein can be used to form a $p^+$ BSF several microns thick with an active peak doping concentration of about $10^{19}$ to about $10^{20}$ atoms per $cm^3$; that is, one or two orders of magnitude higher than is achievable with conventional Al paste (e.g., on the order of $10^{18}$ atoms per $cm^3$). This new Al—B paste uses the higher solid solubility of boron in Si and to increase the dissolution of Al into Si. Therefore Al—B paste makes it possible to deposit thinner paste layers for BSF formation, reduce bowing, and exploit the gettering properties of aluminum to improve minority carrier lifetime in solar cells without losing good ohmic contact properties of the Al—Si layer. FIG. 1 shows measured $p^+$ carrier concentration in silicon after Al—B alloying process using the spreading resistance measurement. The spreading resistance data shows variation on $p^+$ carrier concentration due to roughness caused by the Al—B alloying process.

Organic Vehicle. The pastes herein include a vehicle or carrier which is typically a solution of a resin dissolved in a solvent and, frequently, a solvent solution containing both resin and a thixotropic agent. The organics portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, resin, thixotrope, and/or wetting agent is also envisioned. Although a variety of weight ratios of the solids portion to the organics portion are possible, one embodiment includes a weight ratio of the solids portion to the organics portion from about 20:1 to about 1:20, preferably about 15:1 to about 1:15, and more preferably about 10:1 to about 1:10.

Ethyl cellulose is a commonly used resin. However, resins such as ethyl hydroxyethyl cellulose, wood rosin, mixtures of ethyl cellulose and phenolic resins, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on aluminum, or boron, to modify the contact. N-Diffusol® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; N-tallow trimethylene diamine dioleate, and combinations thereof.

It should be kept in mind that the foregoing compositional ranges are preferred and it is not the intention to be limited to these ranges where one of ordinary skill in the art would recognize that these ranges may vary depending upon specific applications, specific components and conditions for processing and forming the end products.

Other Additives. Other inorganic additives may be added to the paste to the extent of about 1 to about 30 wt %, preferably about 2 to about 25 wt % and more preferably about 5 to about 20 wt % based on the weight of the paste prior to firing. Other additives such as clays, fine silicon, silica, or carbon powder, or combinations thereof can be added to control the reactivity of the aluminum and boron with silicon. Common clays which have been calcined are suitable. Fine particles of low melting metal additives (i.e., elemental metallic additives as distinct from metal oxides) such as Pb, Bi, In, Ga, Sn, Sb, and Zn and alloys of each with at least one other metal can be added to provide a contact at a lower firing temperature, or to widen the firing window.

A mixture of (a) glasses or a mixture of (b) crystalline additives and glasses or a mixture of (c) one or more crystalline additives can be used to formulate a glass component in the desired compositional range. The goal is to reduce bowing and improve the solar cell electrical performance. For example, second-phase crystalline materials such as $Bi_2O_3$, $Sb_2O_3$, $In_2O_3$, $Ga_2O_3$, SnO, ZnO, $SiO_2$, $ZrO_2$, $Al_2O_3$, $B_2O_3$, $V_2O_5$, $Ta_2O_5$, various alumino-silicates, bismuth silicates such as $12Bi_2O_3.SiO_2$, $2Bi_2O_3.SiO_2$, $3Bi_2O_3.5SiO_2$, $Bi_2O_3.4SiO_2$, $6Bi_2O_3.SiO_2$, $Bi_2O_3.SiO_2$, $2Bi_2O_3.3SiO_2$; bismuth titanates such as $Bi_2O_3.2TiO_2$, $2Bi_2O_3.3TiO_2$, $2Bi_2O_3.4TiO_2$, and $6Bi_2O_3.TiO_2$; various vanadates such as $MgO.V_2O_5$, $SrO.V_2O_5$, $CaO.V_2O_5$, $BaO.V_2O_5$, $ZnO.V_2O_5$, $Na_2O.17V_2O_5$, $K_2O.4V_2O_5$, $2Li_2O.5V_2O_5$; and bismuth vanadates such as $6Bi_2O_3.V_2O_5$, $BiVO_4$, $2Bi_2O_3.3V_2O_5$, and $BiV_3O_9$; bismuth vanadium titanates such as $6.5Bi_2O_3.2.5V_2O_5.TiO_2$; zinc titanates such as $2ZnO.3TiO_2$; zinc silicates such as $ZnO.SiO_2$; zirconium silicates such as $ZrO_2.SiO_2$; and reaction products thereof and combinations thereof may be added to the glass component to adjust contact properties. However, the total amounts of the above oxides must fall within the ranges specified for various embodiments disclosed elsewhere herein.

Paste Preparation. The paste according to the present invention may be conveniently prepared on a planetary mixer. The amount and type of carriers utilized are determined mainly by the final desired formulation viscosity, fineness of grind of the paste, and the desired wet print thickness. In preparing compositions according to the present invention, the particulate inorganic solids are mixed with the vehicle and dispersed with suitable equipment, such as a planetary mixer, to form a suspension, resulting in a composition for which the viscosity will be in the range of about 100 to about 500 kcps, preferably about 300 to about 400 kcps, at a shear rate of 9.6 $sec^{-1}$ as determined on a Brookfield viscometer HBT, spindle 14, measured at 25° C.

Printing and Firing of the Pastes. The inventive method of making a solar cell back contact comprises: (1) applying an Al—B containing paste to the P-side of a silicon wafer on which back silver rear contact paste is already applied and dried, (2) drying the paste, and (3) applying the front contact silver paste, and (4) co-firing the front contact, silver rear contact, and Al—B back contact. The solar cell printed with silver rear contact Ag-paste, Al—B back contact paste, and Ag-front contact paste is fired at a suitable temperature, such as about 650-950° C. furnace set temperature; or about 550-850° C. wafer temperature. During firing as the wafer temperature rises above the Al—Si eutectic temperature of 577° C., the back contact Al and B dissolves Si from the substrate and a liquid Al—B—Si layer is formed. This Al—B—Si liquid continues to dissolve substrate Si during further heating to peak temperature. During the cool down period, Si precipitates back from the Al—B—Si melt. This precipitating Si grows as an epitaxial layer on the underlying Si substrate and forms a p+ layer. When the cooling melt reaches the Al—Si eutectic temperature the remaining liquid freezes as an Al—Si eutectic layer. A p+ layer is believed to provide a back surface field (BSF), which in turn increases the solar cell performance. The glass in Al—B back contact should optimally interact with both Al (and/or Al—B materials) and Si without unduly affecting the formation of an efficient BSF layer.

Method of Back Contact Production. A solar cell back contact according to the present invention can be produced by applying any Al—B paste disclosed elsewhere herein, produced by mixing aluminum powders, boron containing materials, with the glass compositions of Tables 1, 2, or 3, to the P-side of the silicon substrate pre-coated with silver rear contact paste, for example by screen printing, to a desired wet thickness, e.g., from about 30 to 50 microns. Front contact Ag pastes are then printed on the front side.

Common to the production of front contacts, back contacts and silver rear contacts is the following. Automatic screen-printing techniques can be employed using a 200-325 mesh screen. The printed pattern is then dried at 200° C. or less, preferably at about 120° C. for about 5-15 minutes before firing. The dry printed Al—B back contact paste of the present invention can be co-fired with the silver rear contact and the front contact silver pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

EXAMPLES

Polycrystalline silicon wafers, used in the following examples were 243 cm$^2$ and about 180 microns thick. These wafers were coated with a silicon nitride antireflective coating on the N-side of Si. The sheet resistivity of these wafers was about 1 Ω-cm. Exemplary glasses of the invention are presented in Table 4.

TABLE 4

Exemplary Glass Compositions

| Glass Mole % | 1 | 2 | 3 |
|---|---|---|---|
| $Bi_2O_3$ | 35.8 | 12.2 | |
| $SiO_2$ | 35.5 | 62.6 | 37.0 |
| $B_2O_3$ | 7.2 | 8.0 | |
| $TiO_2$ | | 5.0 | 18.2 |
| $V_2O_5$ | | | 8.8 |
| $Li_2O$ | | 6.1 | 5.4 |
| $Na_2O$ | | | 20.9 |
| $K_2O$ | 21.5 | 6.1 | 8.8 |
| $P_2O_5$ | | | 0.9 |

Exemplary Al—B formulations in Table 5 were made with the glasses of Table 4 plus commonly used 2-5 micron silver powders or flakes and 4-10 micron aluminum (or aluminum-boron powders), Cabosil®, organic boron and titanium solutions, Anti-Terra® 204, organic vehicles and Texanol®. The clay is $Na_{0.3}(Mg,Li)_3Si_4O_{10}(OH)_2$ which is calcined to drive off water, then pulverized (ball-milled) using conventional means, and wetted at a ratio of 40 wt % calcined clay, 59 wt % terpineol, and 1 wt % Anti-Terra® 204. Anti-Terra® 204 is a wetting agent commercially available from BYK-Chemie GmbH, Wesel, Germany. Cabosil® is fumed silica, commercially available from Cabot Corporation, Billerica Mass. Boron ethoxide and tetraethyl orthotitanate are available from Sigma-Aldrich, Dallas, Tex. Vehicle A is a blend of Texanol® (85.3%), Ethyl cellulose resin (9.5%), Thixatrol-ST (3.3%) and Triton X-100 (1.9%). Vehicle B is a blend of Texanol® (88%) and Thixatrol-ST (12%).

TABLE 5

Exemplary Aluminum-Boron Paste Formulations

| Paste (wt %) | Paste A | Paste B |
|---|---|---|
| Glass 1 powder | | 0.8 |
| Glass 2 powder | | 0.8 |
| Glass 3 powder | 0.5 | |
| Aluminum powder | 70.44 | |
| Aluminum-Boron powder (0.2 wt % B) | | 77.93 |
| Cabosil ® | 0.35 | 0.4 |
| Boron ethoxide solution | 1.5 | |
| Tetraethyl orthotitanate solution | 1.5 | |
| Organic Vehicle A | 6 | 4.5 |
| Organic Vehicle B | 5 | 6.8 |
| Texanol ® | 8.6 | 2.79 |
| Anti-Terra 204 | 1.11 | 1.0 |
| Clay | | 4.98 |
| Alpha-Terpineol | 5.0 | |

The exemplary Al—B back contact pastes in Table 5 were printed on a silicon solar cell pre coated with the back side silver/aluminum paste CN33-451, available from Ferro Corporation, Cleveland, Ohio. Both pastes were printed using 200 mesh screen. After drying the back contact paste, the front contact paste CN33-455, available from Ferro Corporation, Cleveland, Ohio, was printed using a 280 mesh screen with 100 micron openings for finger lines and with about 2.8 mm spacing between the lines. The printed wafers were co-fired using a 3-zone infrared (IR) belt furnace with a belt speed of about 3 meters (120") per minute, with temperature settings of 780° C., 830° C., and 920° C., respectively. The zones were 7", 16", and 7" long, respectively. The fired finger width for the front contact Ag lines was about 120 to 170 microns and the fired thickness was about 10 to 15 microns.

A prior art "low bow" aluminum paste (commercially available Ferro CN53-101) was fired side by side with an aluminum-boron paste according to the invention using Ampal 3510 aluminum powder. About 1.7 grams of the respective pastes were printed onto the silicon wafers. Electrical performance of some of these solar cells was measured with a solar tester, Model 91193-1000, Oriel Instrument Co., Stratford, Conn., under AM 1.5 sun conditions, in accordance with ASTM G-173-03. The electrical properties of the resultant solar cells are set forth in Table 6, which shows typical solar cell electrical properties and bowing for similar wafers for comparison of a prior art low bow Al paste and an Al—B paste of the invention.

TABLE 6

Comparison of Al-B paste fired back contact with prior art Al back contact.

| Paste | Jsc (mA/cm$^2$) | Voc (mV) | FF | Eff (%) | Bowing (mm) |
|---|---|---|---|---|---|
| Paste A (Al/B) (invention) | 33.8 | 605 | 0.72 | 14.8 | 0.5-0.8 |
| Low bow Al paste (prior art) | 33.2 | 600 | 0.71 | 14.1 | 1.2-1.5 |

In Table 6, Jsc means current density; Voc means open circuit voltage measured at zero output current; Efficiency (Eff) is known in the art.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:
1. A solar cell comprising two separate layers, a silicon layer and a contact layer deposited over a surface of the silicon layer and made from a mixture,
  wherein, prior to firing, the mixture comprises:
    a. at least one aluminum source,
    b. at least one boron source, and
    c. about 0.1 to about 10 wt % of a glass component, wherein the glass component is devoid of intentionally added lead in any form, and wherein the glass component comprises:
      (i) about 12 to about 50 mole % $Bi_2O_3$,
      (ii) about 25 to about 65 mole % $SiO_2$,
      (iii) about 5 to about 15 mole % $B_2O_3$, and
      (iv) about 4 to about 26 mole % $K_2O$,
  wherein the content of aluminum is about 50 wt% to about 85 wt % of the mixture, and
  wherein the content of boron is about 0.05 to about 20 wt % of the mixture.

2. The solar cell of claim 1 wherein the aluminum source is selected from the group consisting of aluminum metal powder, an alloy of aluminum, an aluminum salt, organometallic aluminum, an oxide of aluminum, and an aluminum-containing glass.

3. The solar cell of claim 1 wherein the boron source is selected from the group consisting of boron metal powder, a alloy of boron, a salt of boron, boric acid, organometallic boron, an oxide of boron, and boron-containing glass.

4. The solar cell of claim 1, wherein the aluminum source comprises an alloy of aluminum with a metal selected from the group consisting of boron, silicon, gallium, indium, antimony, tin, zinc, and magnesium.

5. The solar cell of claim 4, wherein the aluminum alloy comprises about 60 to about 99.9 wt % aluminum and about 0.1 to about 40 wt % boron.

6. The solar cell of claim 1, wherein the glass component further comprises ZnO, wherein the content of ZnO does not exceed about 55 mole %.

7. The solar cell of claim 1, wherein the glass component further comprises a trivalent oxide of an element selected from the group consisting of an element having an atomic number of from 57 to 71, Al, Ga, In, Sc, and Y, and combinations thereof, provided that the combined total content of such trivalent oxides does not exceed about 25 mol %.

8. The solar cell of claim 7, wherein the glass component further comprises an oxide of an element selected from the group Li, Na, Sb and combinations thereof, provided the combined total of such oxides together with K, does not exceed about 40 mol %.

9. The solar cell of claim 1 wherein the mixture further comprises an additive selected from the group consisting of $SiO_2$, $Sb_2O_3$, $In_2O_3$, $Ga_2O_3$, $SnO$, $ZnO$, $ZrO_2$, $Al_2O_3$, $B_2O_3$, $Na_{0.3}(Mg,Li)_3Si_4O_{10}(OH)_2$, boric acid and combinations thereof.

10. A solar panel comprising the solar cell of claim 1.

11. A process for making a solar cell contact, comprising applying an aluminum- and boron-containing paste to a silicon wafer, and firing the paste wherein, prior to firing, the mixture comprises
  a. at least one aluminum source,
  b. at least one boron source, and
  c. about 0.1 to about 10 wt % of a glass component, wherein the glass component is devoid of intentionally added lead in any form, and wherein the glass component comprises:
    (i) about 12 to about 50 mole % $Bi_2O_3$,
    (ii) about 25 to about 65 mole % $SiO_2$,
    (iii) about 5 to about 15 mole % $B_2O_3$, and
    (iv) about 4 to about 26 mole % $K_2O$,
  wherein the content of aluminum is about 50 wt % to about 85 wt % of the mixture,
  wherein the content of boron is about 0.05 to about 20 wt % of the mixture.

* * * * *